United States Patent [19]

Nam

[11] Patent Number: 5,175,602
[45] Date of Patent: Dec. 29, 1992

[54] PSEUDO BI-PHASE CHARGE COUPLED DEVICE HAVING NARROW CHANNEL EFFECT

[75] Inventor: Jeong-Hyun Nam, Seoul, Rep. of Korea

[73] Assignee: Samsung Electronics Co., Ltd., Kyungki, Rep. of Korea

[21] Appl. No.: 653,723

[22] Filed: Feb. 11, 1991

[30] Foreign Application Priority Data

Oct. 16, 1990 [KR] Rep. of Korea ............... 1990-16436

[51] Int. Cl.[5] .......................................... H01L 29/78
[52] U.S. Cl. ................................... 257/216; 257/236; 257/240
[58] Field of Search ................. 357/24, 24 M, 24 LR; 377/62, 63

[56] References Cited

U.S. PATENT DOCUMENTS

| | | | |
|---|---|---|---|
| 4,589,005 | 5/1986 | Matsuda et al. | 357/24 |
| 4,688,066 | 8/1987 | Elabd | 357/24 |
| 4,839,911 | 6/1987 | Boucharlat | 357/24 |

Primary Examiner—Andrew J. James
Assistant Examiner—Ngan Van Ngo
Attorney, Agent, or Firm—Robert E. Bushnell

[57] ABSTRACT

There is provided a pseudo bi-phase CCD having improved transmission efficiency that is easy for high-integration and can be designed by a simple process. The pseudo bi-phase CCD of the present invention has a gate electrode width which is reduced in a direction opposite to charge transmission direction in a gate electrode. In a charge coupled device having a plurality of gate electrodes formed on a semiconductor through which charges are transferred, the gate electrodes being separated by an insulation film, each of the gate electrodes includes a first part having a first width and a second width which is wider than the first width, the first width gradually increasing as it moves towards the second width formed in a direction of the charge transfer and a second part coupled to the first part, disposed in the charge transfer direction, the second part having the same width as the second width.

12 Claims, 4 Drawing Sheets

PSEUDO BI-PHASE CHARGE COUPLED DEVICE HAVING NARROW CHANNEL EFFECT

BACKGROUND OF THE INVENTION

The present invention relates to a charge coupled device (hereinafter, referred to as CCD), and more particularly to a pseudo bi-phase CCD that is capable of improving transmission efficiency by using narrow channel effect.

CCD is one of those broadly called a charge transfer device and is a dynamic element wherein charges move through a specific path according to a control of clock pulse. Due to such characteristics, being coupled with photo diode, the CCD is diversely and widely used in a technology field of making image signal by sensing photo signal. For example, the CCD is used in an image sensor, video camera, facsimile, video signal processing circuit.

A basic structure of the CCD was initially proposed by Boyle and Smith of the Bell Laboratory in 1969. The earliest structure of CCD is formed metal electrodes having arrays of MOS capacitor. The simple lateral arrangement of gate electrodes, however, was found not appropriate in coupling electric potential well, a structure of coupling gates over gates was therefore proposed.

The most well-known structure of these days is a structure wherein gate electrode is formed of poly-crystal silicon which is isolated by oxide film and therebelow insulator and semiconductor areas. The CCD having such structures is called buried type CCD because a channel potential formed below the gate electrode is transferred to the body of the semiconductor.

In the CCD, transmission efficiency is the key to reliability of the element. And in the channel-buried type CCD, transmission efficiency is improved by injecting into a substrate wafer ion impurities which has conductivity type to that of the substrate wafer, or by forming epitaxial layer which has conductivity type opposed to that of the substrate wafer, so as to transfer the charges.

FIG. 1 illustrates pseudo bi-phase CCD structure of prior art that uses such method that sets the channel potential by differentiating thicknesses of gate insulation films. In the cross-section view of FIG. 1, a semiconductor layer (or an epitaxial layer) 11 having a conductivity type opposed to that of a substrate wafer 10 is formed on the substrate wafer 10. Gate electrodes 12-17 having gate insulation films 18, 19 of thicknesses T1, T2 different from each other are formed on the semiconductor layer 11. As for thickness values of the insulation films, T1 is generally 200-500 Å and T2 is 700-1000 Å.

The first and second transmission clocks $\phi 1$, $\phi 2$ are alternatively applied commonly to the gate electrodes 12, 14 and 16 formed on the gate insulation film 18 of T1 thickness and the gate electrodes 13, 15 and 17 formed on the gate insulation films 19 of T2 thickness. The first and second transmission clocks $\phi 1$, $\phi 2$ are signals that have mutually opposing phases as shown in FIG. 2 and first gate voltages VG1 and VG2 are taken as "low" and "high" states respectively.

Accordingly, when a state of the first transmission clock $\phi 1$ is "high", potential wells 20-23 having well heights of H1, H2, H3 and H4 respectively are formed below the gate electrodes 12-15. Here, it has to be understood that the well heights of H1, H2, H3 and H4 are increased in a direction toward which potential is increased. That is, although the first transmission clock $\phi 1$ is applied to both the gate electrodes 12 and 13, since the gate insulation film 19 below the gate electrode 13 has thickness T2 that is greater than the thickness T1 of the gate insulation film 18 that is below the gate electrode 12, the potential well 21 formed below the gate electrode 13 also becomes deeper than the potential well 20 formed below the gate electrode 12. And it is the same in the case of the gate electrodes 14 and 15. In this case, an electric charge 26 being transmitted stays in the potential well 23 that has the greatest potential. Here, what is meant by great potential is that the potential well is too high for the electric charge therein to escape.

The charge 26 being transmitted to the right-hand side of the drawing as the first and second transmission clocks $\phi 1$, $\phi 2$ are applied to periodically with the phases different from each other as stated above.

Unlike FIG. 1, FIG. 3 illustrates another pseudo bi-phase CCD structure of prior art wherein potential difference is formed by injecting a predetermined ion impurities into a semiconductor layer that is below gate electrodes.

In the structure shown in FIG. 3, ion-injected areas 29, 30 and 31 are formed below every other gate by injecting into a semiconductor layer 28 formed on a substrate wafer 27, ion impurities that have conductivity type opposed to that of the semiconductor layer 28. Gate electrodes 32-37 have gate insulation films that have all the same thickness T3, and neighboring gate electrodes are overlapped. Thereby, the gate electrodes 33, 35 and 37 which have ion-injected areas 29, 30 and 31 therebelow can have greater potential 38, 39 and 40 than the other gate electrodes 32, 34 and 36 to which an identical transmission clock is applied. In the same method as FIG. 1, charge 41 being transmitted stays in the potential well 39 that is the deepest.

Dose density of the ion-injected areas 29, 30 and 31 is approximately $4.0 \times 10^{11}$ ions/cm$^2$ of P-type impurities, when dose density of the semiconductor layer 28 is approximately $3.0 \times 10^{12}$ ions/cm$^2$ of N-type impurities.

As stated above, in the pseudo bi-phase CCD structures of the prior art, the depth of the potential well can be adjusted according to a desired depth, however, since a total of four gate electrodes are required for one transmission stage, it is not only a disadvantage in designing for high-integration but also a blocking element in processing.

SUMMARY OF THE INVENTION

Accordingly, it is an object of the present invention to provide a pseudo bi-phase CCD that is easy for high-integration and can improve transmission efficiency.

It is another object of the present invention to provide a pseudo bi-phase CCD that can be designed by a simple process and has improved transmission efficiency.

To achieve the foregoing objects, the pseudo bi-phase CCD of the present invention has gate electrode width which is reduced in a direction opposite to charge transmission direction in a gate electrode.

According to the present invention, in a charge coupled device having a plurality of gate electrodes formed on a semiconductor through which charges are transferred, the gate electrodes being separated by an insulation film, each of the gate electrodes includes: a first part having a first width and a second width which is wider than the first width, the first width gradually increasing as it moves towards the second width formed in a direction of the charge transfer; and a second part coupled to the first part, disposed in the charge transfer direction, the second part having the same width as the second width.

BRIEF DESCRIPTION OF THE ATTACHED DRAWINGS

For a better understanding of the invention and to show how the same may be carried into effect, reference will now be made, by way of example, to the accompanying diagrammatic drawings, in which.

DETAILED DESCRIPTION OF THE INVENTION

Figure 1:
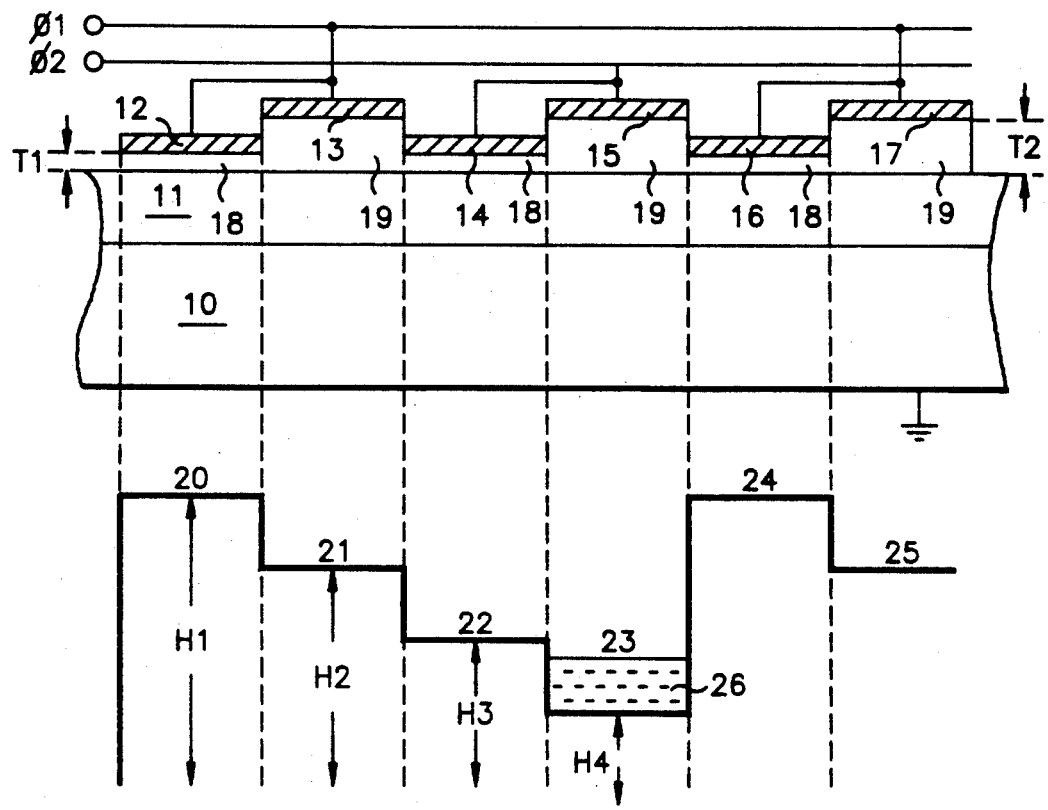
FIG. 1 is a diagram of a structure and channel potential distribution of a conventional pseudo bi-phase CCD.
Figure 2:
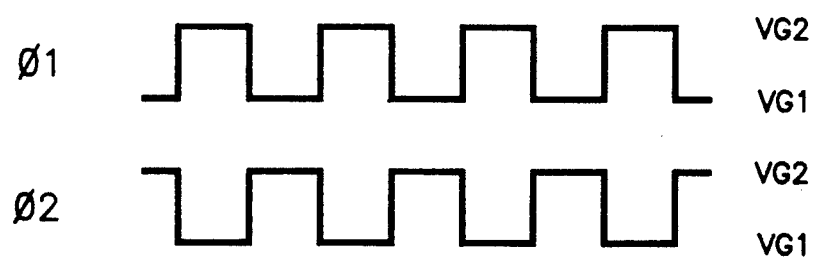
FIG. 2 is a waveform diagram of the pseudo transmission clock that is used in electric charge transmission.
Figure 3:
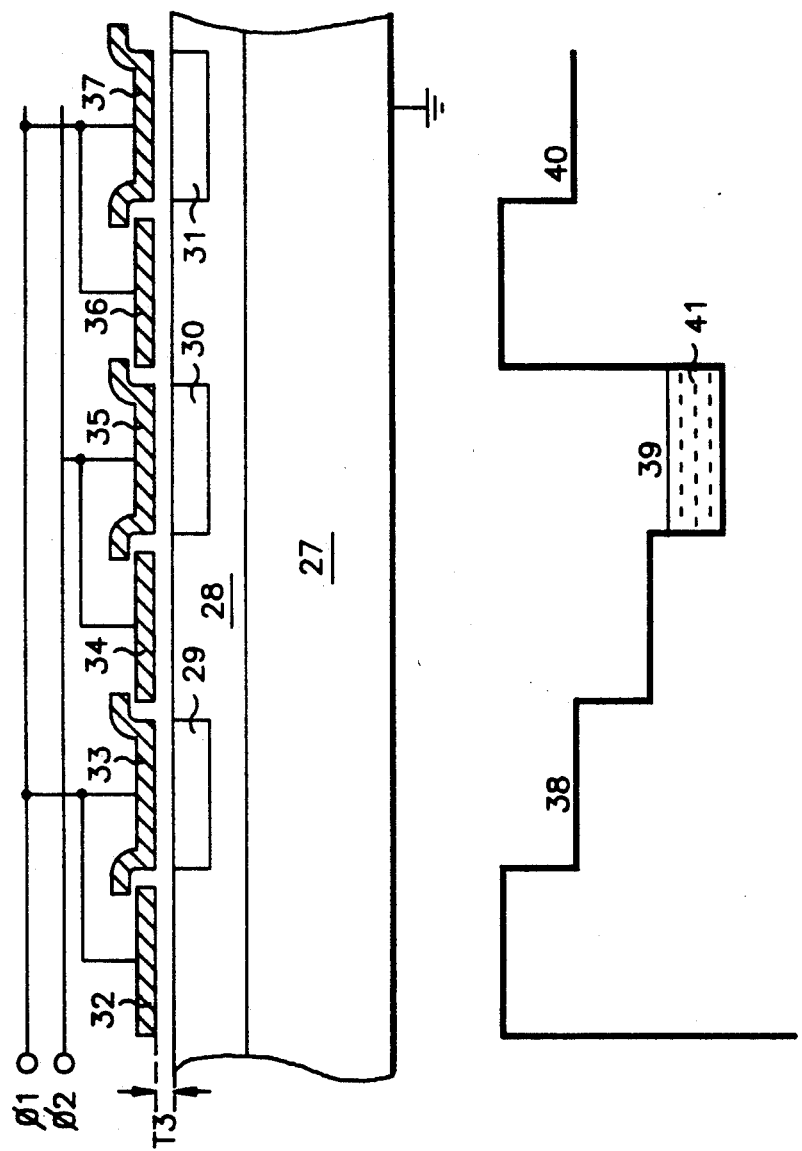
FIG. 3 is a diagram of a structure and channel potential distribution of another conventional pseudo bi-phase CCD.
Figure 4A:
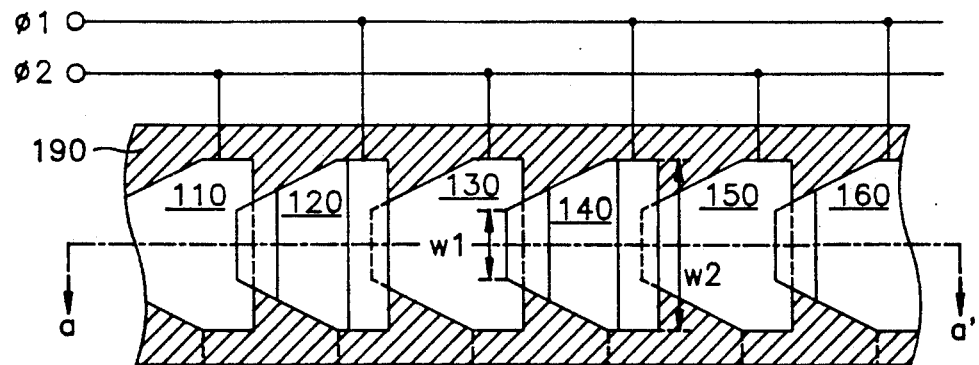
FIG. 4A is a planar diagram of a pseudo bi-phase CCD according to the present invention.

Referring to FIG. 4A, each of gate electrodes 110, 120, 130, 140, 150 and 160 is overlapped with neighboring electrodes and has two widths of W1 and W2. At the surroundings of the gate electrodes, channel stop area 190 is formed. The first and second transmission clocks $\phi 1$, $\phi 2$ that are alternatively applied to the gate electrodes are identical to those illustrated in FIG. 2. Each electrode has greater width as located more towards a direction to which the electric charge is transmitted (from the left to the right on the diagram), and a pattern shown in FIG. 4A is presented as an embodiment according to the present invention.

Figure 4B:
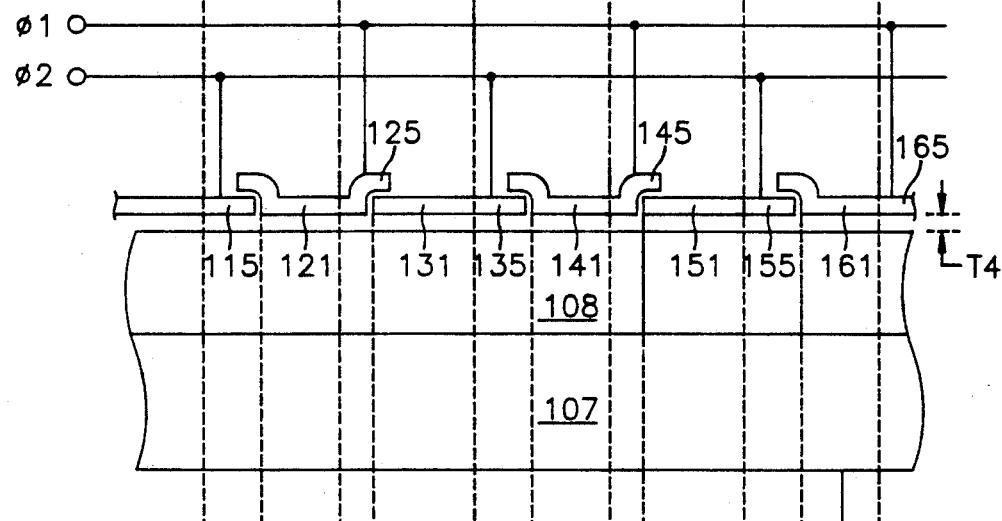
FIG. 4B is a cross-section view according to a cutting line a—a' of FIG. 4A.

Referring to FIG. 4B, on a substrate wafer 107, a semiconductor layer 108 having a type of conductivity opposed to that of the substrate wafer 107 is formed, and gate electrodes are arranged on a gate insulation film having thickness of T4 (200-1500 Å). The gate electrodes 110-160 of the FIG. 4A can be divided as first parts 121, 131, 141, 151 and 161 respectively that are sloped from a first width W1 towards a second width W2 and second parts 115, 125, 135, 145, and 155 that have the second width W2, and each of the first and second parts form each of the gate electrodes illustrated in FIG. 4A. For example, the gate electrode of FIG. 4B corresponding to the gate electrode 120 of FIG. 4A is formed of the first part 121 and the second part 125.

Figure 4C:
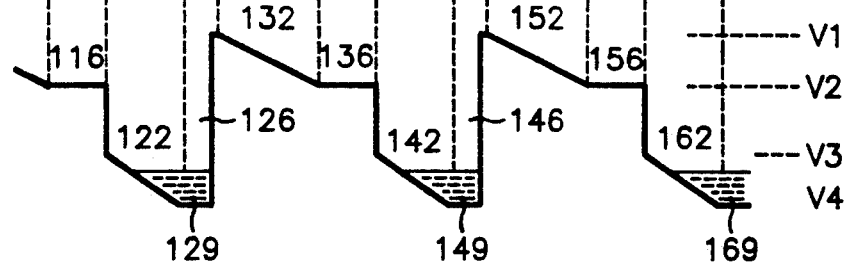
FIG. 4C is a channel potential distribution diagram of the present invention according to FIGS. 4A and 4B.

Referring to FIG. 4C, potential wells are different in their forms in the first parts 121-161 and the second parts 115-155 of the gate electrodes. That is, potential wells 122, 132, 142, 152 and 162 that are formed by the first parts 121-161 are sloped in a direction towards which potential is increased as the width of the gate is increased, and potential wells 116, 129, 136, 149, 156 and 169 that are formed by the second parts 115-155 have a predetermined potential. In the potential wells 122, 132, 142, 152 and 162 that are formed below the first parts 121-161, the reason why potential well gets deeper towards where width of the gate is becoming greater, that is, towards the second width W2, can be understood easily by reflecting on typical characteristics of a capacitance.

What is to be known here is that the formation of the potential wells illustrated in FIG. 4C shows a case where the first transmission clock $\phi 1$ and the second transmission clock $\phi 2$ are "high" (hereinafter, referred to as a first gate voltage) and "low" (hereinafter, referred to as a second gate voltage) respectively. Because one gate electrode has two gate widths W1 and W2, a potential well formed below one gate electrode gets two states of channel potentials. That is, for example, below the gate electrodes 120, 140 and 160 to which the first gate voltage VG1 is applied, channel potentials V1, V2 are formed according to the first width W1 and the second width W2 respectively. And below the gate electrodes 110, 130 and 150 to which the second gate voltage VG2 is applied, channel potentials V3, V4 are formed according to the first width W1 and the second width W2 respectively. Therefore, two gates are sufficient for one transmission stage.

Figure 5:
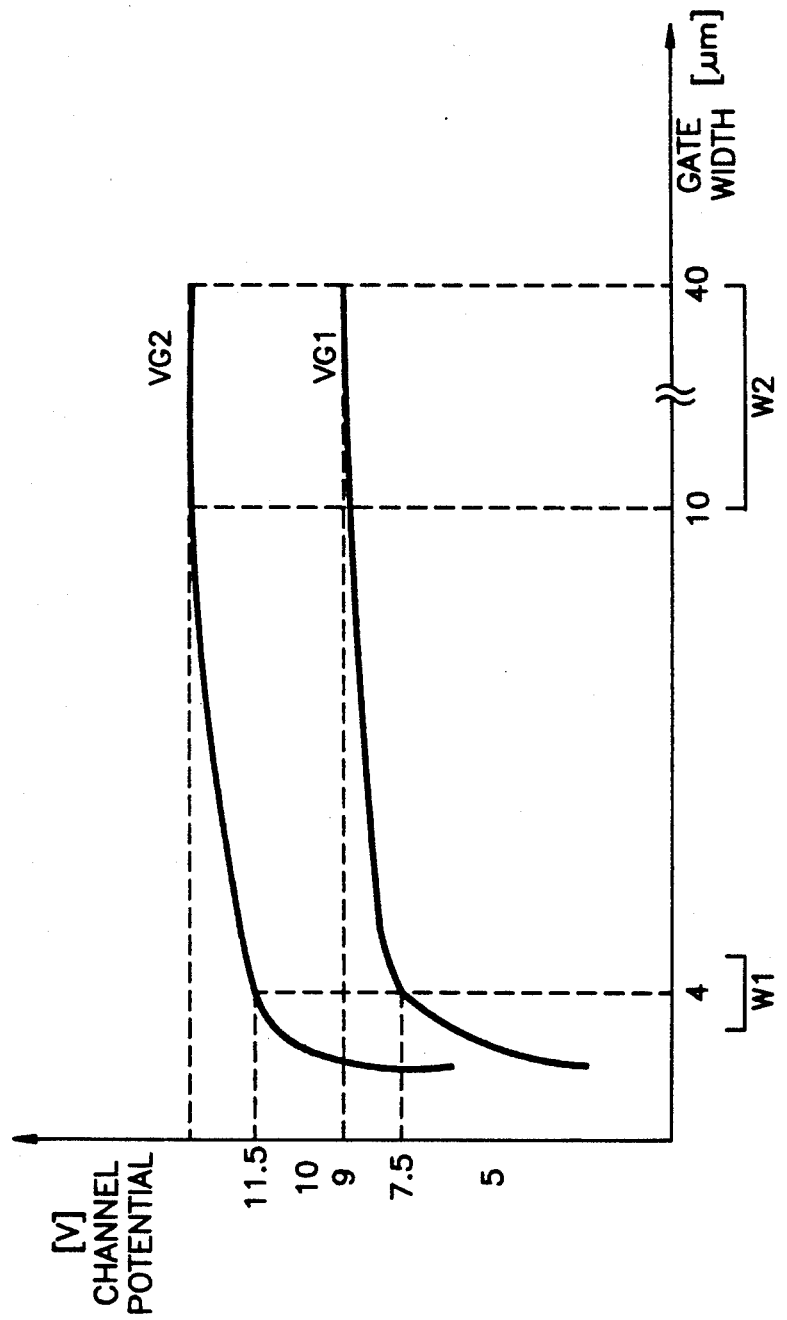
FIG. 5 is a graph illustrating a relationship between a width of gate electrode and channel potential according to the present invention.

Referring to FIG. 5, this graph is created based on actually-measured values and is according to the states of the potential wells illustrated in FIG. 4C. And the first gate voltage VG1 and the second gate voltage VG2 are applied to the gate electrodes 120, 140 and 160 and the gate electrodes 110, 130 and 150 respectively as assumed in the foregoing description. As can be known from the graph, the channel potential increases sharply while the width of the gate electrode increases up to approximately 4 $\mu$m, but the increase of the channel potential is minute between approximately 4-10 $\mu$m and thereafter the increase of the channel potential stays at a sustained level regardless of the increase of the width of the gate electrode. It can be understood that this characteristic does not have to do with level of the gate voltage. Therefore, when the first width W1 and the second width W2 of the gate electrode are set to 4 $\mu$m and 10-40 $\mu$m respectively, the channel potentials V1, V2, V3 and V4 correspond to 7.5 V, 9 V, 11.5 V and 13.2 V respectively. And between the channel potentials V1 and V2, and between the channel potentials V3 and V4, the channel potentials increase linearly.

Since linear increase of the channel potential is a condition that electric field is generated, electric charge can be transmitted better in the condition than in a state of step potential of prior art.

It can be easily understood that the second width W2 of the gate electrode can be set at 10-40 $\mu$m because the channel potential is almost constant beyond 10 $\mu$m and it is disadvantageous to set the maximum width of the gate electrode at greater than 40 $\mu$m in high integration of an element.

As described in the foregoing, the present invention has an advantage in high-integration of bi-phase CCD because one stage can be formed of only two gate electrodes by giving two different widths to one gate electrode. In addition, the present invention has an effect that highly efficient transmission of electric charge is achieved even at high-speed operation by being capable of creating slope of the channel potential in the bi-phase CCD.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. In a charge coupled device having a plurality of gate electrodes formed on a semiconductor through which charges are transferred, said gate electrodes being separated by an insulation film, each of said gate electrodes comprising:
   a first portion in a trapezoid shape having a first width and a second width of greater diameter than said first width, said first width gradually increasing toward said second width in a charge transfer direction; and
   a second portion in a rectangular shape coupled to said first portion, disposed in the charge transfer direction, said second portion having the same width as said second width.

2. In a charge coupled device as claimed in claim 1, wherein said first width of said first portion of said gate electrode is approximately 3 to 5 $\mu$m, and said second width of said first portion of said gate electrode is approximately about 10 to 40 $\mu$m.

3. A charge coupled device, comprising:
   a semiconductor region of one conductivity type,
   an insulating layer formed on said semiconductor region, and
   a plurality of gate electrodes formed in a row within a cross section over said insulating layer, said gate electrodes being disposed to receive clock pulses for producing potential walls in said semiconductor region to transfer charges along said row in a charge transfer direction, each of said gate electrodes comprising:
   a first portion and a second portion, said first portion defining a trapezoid shape having a first width transverse to said direction, and a second width transverse to said direction and greater in length than said first width, with a cross-sectional width of said first portion gradually increasing toward said second portion in said charge transfer direction; and
   a second portion defining in a rectangular shape integrally joined to said first portion and having the same width as said second width of said first portion.

4. The charge coupled device of claim 3, further comprised of:
   said first width of said first portion of each of said gate electrodes is approximately about 3 to 5 $\mu$m, and
   said second width of said first portion of each of said gate electrodes is approximately about 10 to 40 $\mu$m.

5. The charge coupled device of claim 3, wherein said first width of said first portion of each of said gate electrodes overlaps with the second portion of a preceding gate electrode in along said charge transfer direction, and said second width of said second portion of each of said gate electrodes is overlapped by the first portion of a subsequent gate electrode along said charge transfer direction.

6. The charge coupled device of claim 3, further comprised of:
   said first width of said first portion of each of said gate electrodes is approximately 3 to 5 $\mu$m, and
   said second width of said first portion of each of said gate electrodes is approximately about 10 to 40 $\mu$m.

7. The charge coupled device of claim 3, further comprised of said insulating layer having a thickness approximately about 200 to 1500 angstroms.

8. A charge coupled device, comprising:
   a semiconductor substrate having a first conductivity type;
   a semiconductor region having a second conductivity type formed on said semiconductor substrate;
   an insulating layer formed on said semiconductor region;
   a plurality of gate electrodes formed in a row within a cross section over said insulating layer, said gate electrodes overlapping one another along said row, and said gate electrodes disposed to receive clock pulses for producing potential wells in said semiconductor region to transfer charges along said row in a charge transfer direction, each of said gate electrodes comprising:
   a first portion and a second portion, said first portion defining a trapezoid shape having a first width transverse to said direction, and a second width transverse to said direction and greater in length than said first width, width of said first portion gradually increasing toward said second portion in said charge transfer direction; and
   a second portion defining in a rectangular shape integrally joined to said first portion and having the same width as said second width of said first portion.

9. The charge coupled device as claimed in claim 8, further comprised of:
   said first width of said first portion of each of said gate electrodes is approximately 3 to 5 $\mu$m, and
   said second width of said first portion of each of said gate electrodes is approximately about 10 to 40 $\mu$m.

10. The charge coupled device as claimed in claim 8, further comprised of:
    first means for applying first clock pulses to alternate ones of said plurality of gate electrodes; and
    second means of applying different clock pulses to ones of said adjacent gate electrodes intermediate to said alternate ones of said plurality of gate electrodes.

11. The charge coupled device as claimed in claim 8, further comprised of said insulating layer having a thickness of approximately 200 to 1500 angstroms.

12. A charge coupled device as claimed in claim 3, wherein said first width of said first portion of each of said gate electrodes overlaps and are overlapped alternatively with the second portion of a preceding gate electrode along said charge transfer direction, and said second width of said second portion of each of said gate electrodes is overlapped by the first portion of a subsequent gate electrode along said charge transfer direction.

* * * * *

UNITED STATES PATENT AND TRADEMARK OFFICE
CERTIFICATE OF CORRECTION

PATENT NO. : 5,175,602
DATED : 29 December 1992
INVENTOR(S) : Jeong-Hyun NAM

It is certified that error appears in the above-indentified patent and that said Letters Patent is hereby corrected as shown below:

IN THE SPECIFICATION

Column 1,

Line 39,    before "to" insert --opposed--,

Column 2,

Line 60,    before "gate", insert -- a --:

Signed and Sealed this

Eighteenth Day of June, 1996

Attest:

BRUCE LEHMAN

*Attesting Officer*    *Commissioner of Patents and Trademarks*